United States Patent
Takada

(10) Patent No.: US 8,115,509 B2
(45) Date of Patent: Feb. 14, 2012

(54) SEMICONDUCTOR INTEGRATED CIRCUIT FOR REDUCING CROSSTALK

(75) Inventor: Shuichi Takada, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/717,442

(22) Filed: Mar. 4, 2010

(65) Prior Publication Data

US 2011/0062982 A1 Mar. 17, 2011

(30) Foreign Application Priority Data

Sep. 16, 2009 (JP) .................................. 2009-214629

(51) Int. Cl.
*H03K 17/16* (2006.01)

(52) U.S. Cl. .......................................... 326/27; 326/21

(58) Field of Classification Search .................. 326/26, 326/29
See application file for complete search history.

(56) References Cited

U.S. PATENT DOCUMENTS 5,963,110 A 10/1999 Ihara et al.
7,456,655 B1 * 11/2008 Ben Artsi ........................ 326/82

FOREIGN PATENT DOCUMENTS

JP 2008-083815 4/2008
JP 2008-123458 5/2008

* cited by examiner

*Primary Examiner* — Shawki S Ismail
*Assistant Examiner* — Thienvu V Tran
(74) *Attorney, Agent, or Firm* — Turocy & Watson, LLP

(57) ABSTRACT

A chip is provided with a specific signal wire and two adjacent signal wires. Output signals based on a specific signal and two adjacent signals are transmitted to the specific signal wire and the two adjacent signal wires respectively. An adjustment coefficient is stored in a memory. The adjustment coefficient is used for reducing an occurrence amount of crosstalk arising between the specific signal wire and the two adjacent signal wires. An adjustment quantity calculation portion calculates an adjustment quantity representing a degree of decrease of a slew rate of the specific signal, based on the adjustment coefficient, the specific signal and the two adjacent signals. A driver adjusts the slew rate of the specific signal based on the adjustment quantity and to transmit one of the output signals corresponding to the specific signal.

5 Claims, 8 Drawing Sheets

| ADJUSTMENT QUANTITY | SLEW RATE | CONTROL SIGNAL | | | CURRENT VALUE | | | | |
|---|---|---|---|---|---|---|---|---|---|
| | | ep3 | ep2 | ep1 | Iop | Icp3 | Icp2 | Icp1 | TOTAL |
| 1 | 25psec | 0 | 0 | 0 | 10mA | 8mA | 4mA | 2mA | 24mA |
| 2 | 50psec | 0 | 0 | 1 | 10mA | 8mA | 4mA | 0mA | 22mA |
| 3 | 75psec | 0 | 1 | 0 | 10mA | 8mA | 0mA | 2mA | 20mA |
| 4 | 100psec | 0 | 1 | 1 | 10mA | 8mA | 0mA | 0mA | 18mA |
| 5 | 125psec | 1 | 0 | 0 | 10mA | 0mA | 4mA | 2mA | 16mA |
| 6 | 150psec | 1 | 0 | 1 | 10mA | 0mA | 4mA | 0mA | 14mA |
| 7 | 175psec | 1 | 1 | 0 | 10mA | 0mA | 0mA | 2mA | 12mA |
| 8 | 200psec | 1 | 1 | 1 | 10mA | 0mA | 0mA | 0mA | 10mA |
| | | en3 | en2 | en1 | Ion | Icn3 | Icn2 | Icn1 | TOTAL |
| 1 | 25psec | 1 | 1 | 1 | 10mA | 8mA | 4mA | 2mA | 24mA |
| 2 | 50psec | 1 | 1 | 0 | 10mA | 8mA | 4mA | 0mA | 22mA |
| 3 | 75psec | 1 | 0 | 1 | 10mA | 8mA | 0mA | 2mA | 20mA |
| 4 | 100psec | 1 | 0 | 0 | 10mA | 8mA | 0mA | 0mA | 18mA |
| 5 | 125psec | 0 | 1 | 1 | 10mA | 0mA | 4mA | 2mA | 16mA |
| 6 | 150psec | 0 | 1 | 0 | 10mA | 0mA | 4mA | 0mA | 14mA |
| 7 | 175psec | 0 | 0 | 1 | 10mA | 0mA | 0mA | 2mA | 12mA |
| 8 | 200psec | 0 | 0 | 0 | 10mA | 0mA | 0mA | 0mA | 10mA |

FIG. 6

ID_CIRCUIT
SEMICONDUCTOR INTEGRATED CIRCUIT FOR REDUCING CROSSTALK

CROSS REFERENCE TO RELATED APPLICATION

This application is based upon and claims the benefit of priority from the prior Japanese Patent Application No. 2009-214629, filed on Sep. 16, 2009, the entire contents of which are incorporated herein by reference.

FIELD OF THE INVENTION

The invention relates to a semiconductor integrated circuit to reduce crosstalk.

DESCRIPTION OF THE BACK GROUND

In a fast bus system such as a DDR (Double-Data-Rate Synchronous Dynamic Random Access Memory), lots of signals of signal wires transit at a time. The signal transition may cause crosstalk between the signal wires. The crosstalk is a signal interference occurring between the signal wires when the signal wires are arranged in physical proximity to each other. The crosstalk generates jitter in the signal transition so that an eye opening of data may become small. Accordingly, reducing the crosstalk and achieving a wide eye opening is effective for increasing the rate of data transmission and for increasing a process-resistant variation margin.

Japanese Patent Application Publication No. 2008-123458 discloses various improvements, as follows, in order to reduce the crosstalk between signal wires. One of the improvements is, for example, to perform a simulation by combining a real driver circuit, a package model and a PCB (Printed Circuit Board) model. This improvement is aimed to feed the simulation result back to design of packages and PCBs so as to reduce effect of the crosstalk in advance.

Another improvement is to arrange power supply/ground wires between signal wires so as to reduce coupling capacitance between the signal wires and decrease the crosstalk.

However, these kinds of improvements may cause the following problems. In the former improvement, package designing process needs to be repeated in order to increase noise margin, and accordingly, it takes more time in designing the package. In addition, due to restriction of design, it may be impossible to settle the crosstalk.

In the latter improvement, the coupling capacitance between the signal wires can be reduced by arranging the ground/power supply wires between the signal wires. However, the number of the ground/power supply wires increases so that the number of effective signals allocated to the package decreases. Further, the cost of fabricating the package may increase.

SUMMARY OF THE INVENTION

An aspect of the present invention provides a semiconductor integrated circuit for transmitting output signals based on a specific signal and two adjacent signals to a specific signal wire and two adjacent signal wires respectively, which includes an adjustment quantity calculation portion to calculate an adjustment quantity representing a degree of decrease of a slew rate of the specific signal, based on an adjustment coefficient for reducing an occurrence amount of crosstalk arising between the specific signal wire and the two adjacent signal wires and the specific signal and the two adjacent signals, and a driver to adjust the slew rate of the specific signal based on the adjustment quantity and to transmit one of the output signals corresponding to the specific signal.

BRIEF DESCRIPTION OF THE DRAWINGS

FIG. 6 is a view for illustrating relationship between adjustment quantity outputted from the signal calculation portion, slew rates of output signals and current values outputted from a driver of the output circuit.

DETAILED DESCRIPTION OF THE INVENTION

Figure 1:
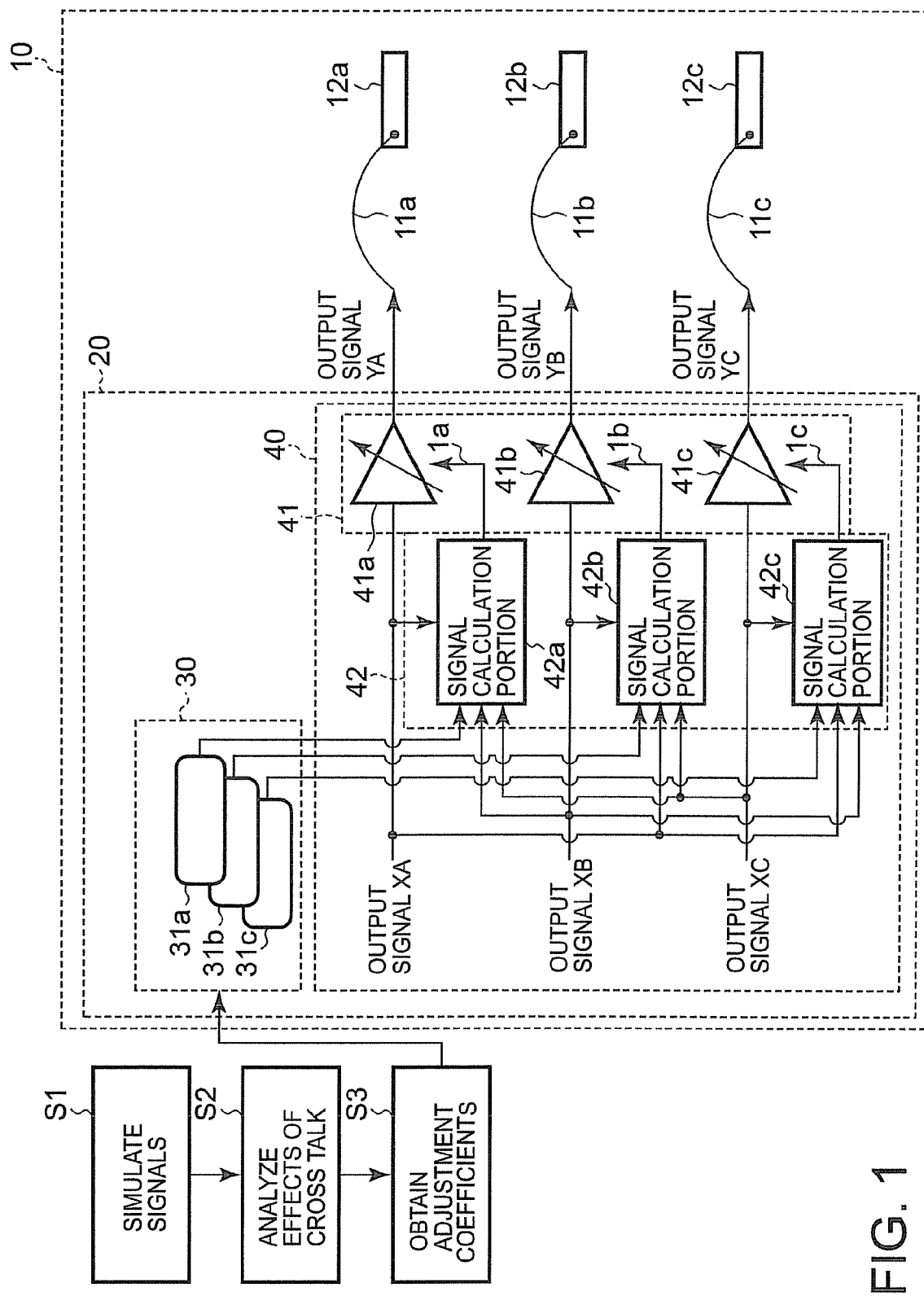
FIG. 1 is a block diagram showing a configuration of a semiconductor integrated circuit according to a first embodiment of the invention.

Hereinafter, embodiments of the invention will be described with reference to the drawings. The same numerals denote the same or similar portions in the drawings, respectively.

Figure 2:
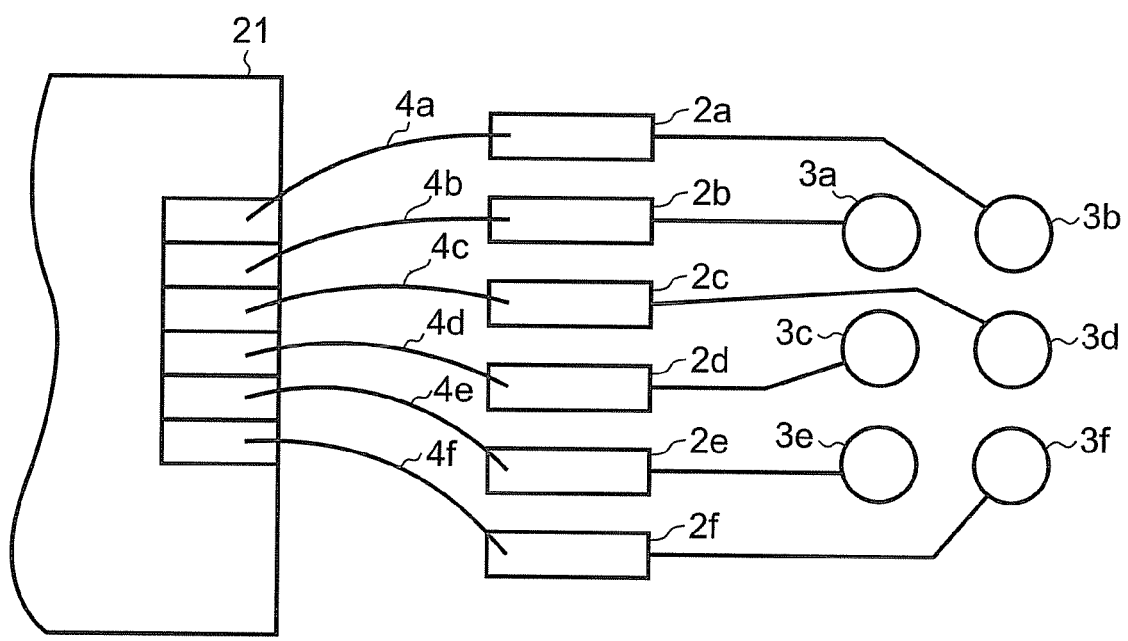
FIG. 2 is a diagram showing one example of a package model.

A semiconductor integrated circuit according to a first embodiment of the invention will be described with reference to FIGS. 1 to 3. FIG. 1 is a block diagram showing a configuration of a semiconductor integrated circuit according to the first embodiment of the invention. FIG. 2 shows an example of a package model. FIG. 3 is a view for illustrating crosstalk occurring in the package model of FIG. 2.

FIG. 1 shows a semiconductor integrated circuit, i.e., a package model, for example, an LSI (Large Scale Integrated circuit) 10. The LSI 10 includes a chip 20, package terminals 12a to 12c, and bonding wires 11a to 11c between the package terminals 12a to 12c and output ends of the chip.

The chip 20 includes an LSI internal memory 30 and an output circuit 40 serving as the signal drive circuit. The output circuit 40 mainly includes a signal calculation portion 42 serving as a adjustment quantity calculation portion and a driver portion 41. In the output circuit 40 illustrated in FIG. 1, for example, the signal calculation portion 42 includes three signal calculation portions 42a to 42c, and the driver portion 41 includes three drivers 41a to 41c. However, the numbers of portions and drivers are not limited to the above numbers.

The signal calculation portions 42a to 42c will be explained in detail.

The signal calculation portion 42a receives an output signal XA (one of two adjacent signals), an output signal XB (one specific signal), an output signal XC (the other of the two adjacent signals) and an adjustment coefficient 31a stored in an LSI internal memory 30. The signal calculation portion 42a calculates an adjustment quantity 1a representing a degree of decrease in a slew rate of the output signal XA.

The signal calculation portion 42b receives the output signal XA, the output signal XB, the output signal XC and an adjustment coefficient 31b. The signal calculation portion 42b calculates an adjustment quantity 1b representing a degree of decrease in a slew rate of the output signal XB.

The signal calculation portion 42c receives the output signal XA, the output signal XB, the output signal XC and an adjustment coefficient 31c. The signal calculation portion 42b calculates an adjustment quantity 1c representing a degree of decrease in a slew rate of the output signal XC.

The internal configuration of each of the signal calculation portions 42a to 42c will be explained below.

The adjustment coefficients 31a to 31c are used to reduce the occurrence amount of crosstalk occurring between the bonding wire 11b (one specific signal wire), the bonding wire 11a (one of two adjacent signal wires) adjacent to the bonding wire 11b, and the bonding wire 11c (the other of the two adjacent signal wires) adjacent to the bonding wire 11b.

Subsequently, the drivers 41a to 41c will be explained in detail. For example, the driver 41b receives the output signal XB and the adjustment quantity 1b, and adjusts the slew rate of the output signal XB on the basis of the adjustment quantity 1b. The internal configuration of each of drivers 41a to 41c will be explained below.

In the above explanation, the signal calculation portion 42b and the driver 41b are mainly used to adjust the crosstalk between the bonding wires 11c and the bonding wire 11a adjacent to the bonding wire 11b. The same is also applicable to a case where the signal calculation portion 42a and the driver 41a are mainly used, for example.

More specifically, for example, when there is an adjacent signal wire on the upper side (on the left of the package terminal) of the bonding wire 11a, the adjacent signal wire serves as "one of adjacent signal wires" and the bonding wire 11b serves as "the other of adjacent signal wires". This is also applicable to a case where the signal calculation portion 42c and the driver 41c are mainly used, for example.

Figure 3A:
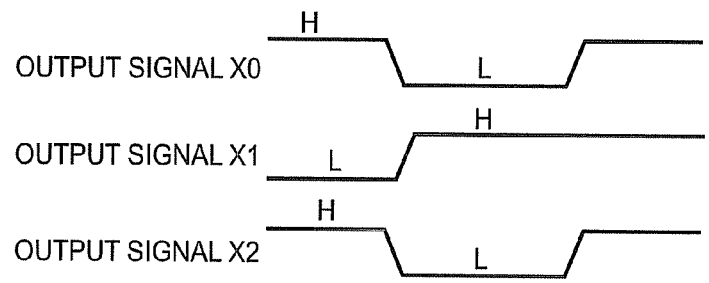
FIGS. 3A and 3B are views for illustrating crosstalk occurring in the package model of FIG. 2.

Subsequently, the adjustment coefficients 31a to 31c set in the LSI internal memory 30 will be explained with reference to FIG. 2 and FIGS. 3A and 3B. FIG. 2 shows, a chip 21, package terminals 2a to 2f, external connection terminals 3a to 3f, i.e., balls installed as a BGA (Ball Grid Array), and bonding wires 4a to 4f, which is employed in an example of the package model. The crosstalk occurs, for example, at the bonding wires 4c and the external connection terminal 3d, or the bonding wires 4e and the external connection terminal 3e.

The crosstalk occurs when the level of output signals transmitted from the chip 21 to the bonding wires transits from high (hereinafter simply referred to as "H") to low (hereinafter simply referred to as "L") or from "L" to "H".

The relationship between the crosstalk and three output signal X0 to X2 on the bonding wires will be specifically described with reference to FIGS. 3A and 3B. In FIG. 3A, the three output signals X0 to X2 flowing in the bonding wires are shown as an example. Each of the output signals changes from "H" to "L" or from "L" to "H".

It is assumed that the output signals X0 and X2 change from "H" to "L", and the output signal X1 changes from "L" to "H". The timing of changes of the output signals X0, X1, and X2 is assumed to be substantially the same. The waveform of the output signal X1 may be greatly deformed by a jitter, i.e., so called crosstalk, generated by the output signal X0 and X2 as shown in a waveform a of FIG. 3B.

The factors causing the crosstalk are considered to include mutual inductance between the bonding wires, coupling capacity, and combination pattern of the output signals. Especially, the influence caused by the mutual inductance is known to be a major factor. Especially, the bonding wire transmitting the output signal X1 is arranged between the bonding wires transmitting the output signal X0 and the bonding wires transmitting the output signal X2. Therefore, the output signal X1 is likely to be affected by the output signals X0 and X2.

The degree of effect caused by the crosstalk differs depending on a combination pattern of the output signals. For example, patterns of the output signals shown in FIGS. 3A and 3B will be explained. The output signals X0 and X2 change from "H" to "L", but the output signal X1 changes from "L" to "H". In the combination pattern of the output signals, the output signal X1 is likely to be affected by the effect of the adjacent bonding wire, and the eye opening of the output signal X1 tends to be small.

In view of the above issue, the degree of the effect of the crosstalk can be analyzed by using the combination patterns of the output signals and wiring information such as intervals of bonding wires. More specifically, as shown on the left side of FIG. 1, signal simulation is performed using a package model and a PCB wiring model in advance (Step S1). Subsequently, combination pattern of output signals, which influences the crosstalk much, is analyzed (Step S2). Further, adjustment coefficients can be derived to reduce the influence exerted by the crosstalk on the adjacent output signal, for example, X1 (Step S3). In accordance with such steps, adjustment coefficients 31a to 31c can be obtained.

The adjustment coefficient is obtained, for example, by adjusting the slew rate of the output signal in a particular pattern of each output signal. In FIG. 3B, when the slew rates of the output signal X0 and the output signal X2 are, for example, 50 psec, the waveform of the output signal X1 is assumed to deform as shown in FIG. 3B.

In order to alleviate the deformation of the waveform, it is effective to set the slew rates of the output signal X0 and the output signal X2 to be values slower than 50 psec. However, when the slew rates are too slow, there may be a case where a receiving side cannot accurately recognize the data pattern, and therefore, it is preferable to be aware of the issue. The LSI internal memory 30 according to the embodiment sets the obtained adjustment factors as the adjustment coefficients 31a to 31c shown in FIG. 1.

Figure 4:
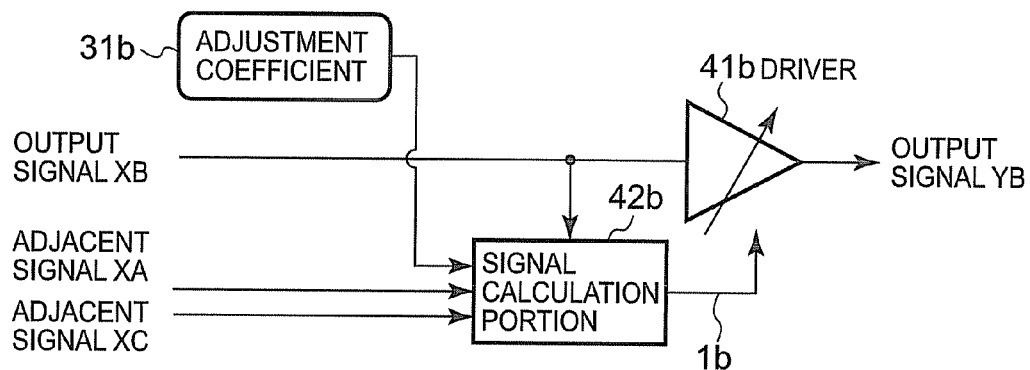
FIG. 4 is a block diagram showing a configuration of an output circuit according to the first embodiment of the invention.
Figure 5:
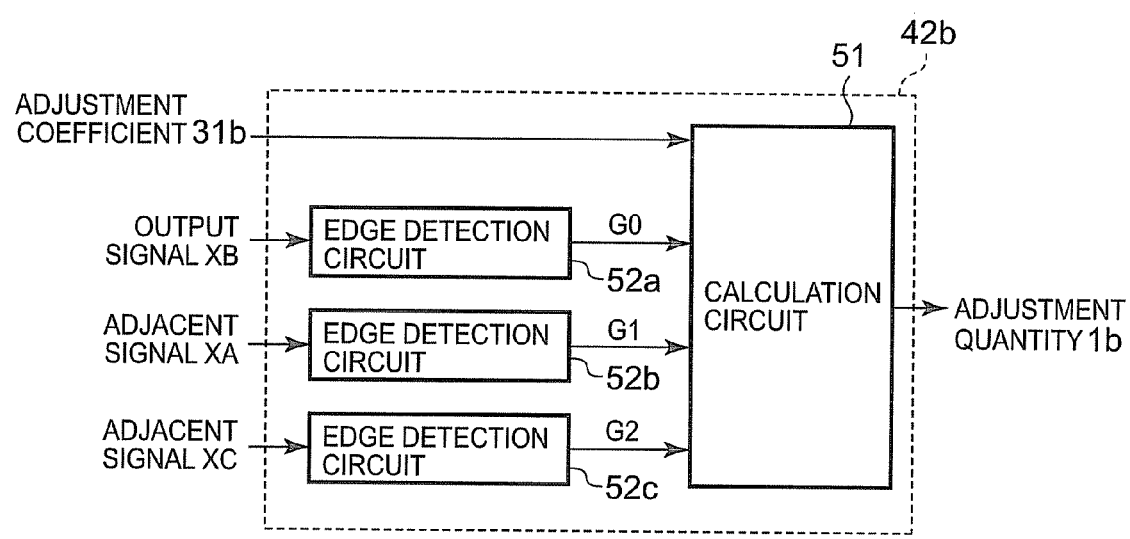
FIG. 5 is a block diagram showing a configuration of a signal calculation portion according to the first embodiment of the invention.

Hereinafter, each constituent element of the output circuit 40, i.e., the signal drive circuit will be described in detail. FIG. 4 is a block diagram showing a part of a configuration of the output circuit 40 according to the first embodiment. FIG. 5 is a block diagram showing a configuration of the signal calculation portion 42b according to the first embodiment. FIG. 6 is a figure for illustrating relationship between the adjustment quantity outputted from the signal calculation portion 42b and slew rates of the output signals and current values outputted from drivers.

FIG. 4 shows a portion of the output circuit 40 shown in FIG. 1. Below, the signal calculation portion 42b, the driver 41b, and the adjustment coefficient 31b in the output circuit 40 of FIG. 1 are representatively shown in order to explain relationship between the crosstalk affecting an adjacent signal wire and the constituent elements in an easy-to-understand manner. The remaining portions of the output circuit 40 shown in FIG. 1 have a similar configuration.

Below, operation of each element shown in FIG. 4 is explained. In the explanation, it is assumed that the crosstalk, which is caused on the bonding wires 11a (one of adjacent signal wires) by the bonding wire 11b and which is caused on the bonding wire 11c (the other of the adjacent signal wires) by the bonding wires 11b, is reduced.

FIG. 5 shows the internal configuration of the signal calculation portion 42b shown in FIG. 4. The signal calculation portion 42b mainly includes edge detection circuit 52a to 52c for inputting output signals and outputting edge detection signals, and a calculation circuit 51 for inputting the adjustment coefficient 31b and includes the edge detection signals G0 to G2 respectively provided from the edge detection circuits 52a to 52c to calculate the adjustment quantity.

Each of the edge detection circuits 52a to 52c detects rise and fall of the received output signal XB, the adjacent signal XA and the adjacent signal XC, and outputs the edge detection signals G0 to G2. For example, each of the edge detection circuits 52a to 52c outputs +1 at a rise of a signal, outputs −1 at a fall, and outputs 0 when a signal does not change.

The calculation circuit 51 performs the following calculation, for example.

Adjustment Amount=G0*(Adjustment Coefficient A*(G1+G2)+Adjustment Coefficient B)

The adjustment coefficient A is a value of each adjustment coefficient 31a, 31b or 31c, and is used to correct transitionally varied voltage included, for example, in the output signal XB, the adjacent signal XA, or the adjacent signal XC. The adjustment coefficient B is used to set the predetermined adjustment quantity according to the values of the edge detection signals G1 and G2. For example, when G1+G2=0 holds, the adjustment coefficient B is a default value set so that the adjustment quantity shown in FIG. 6 becomes 5.

Figure 7:
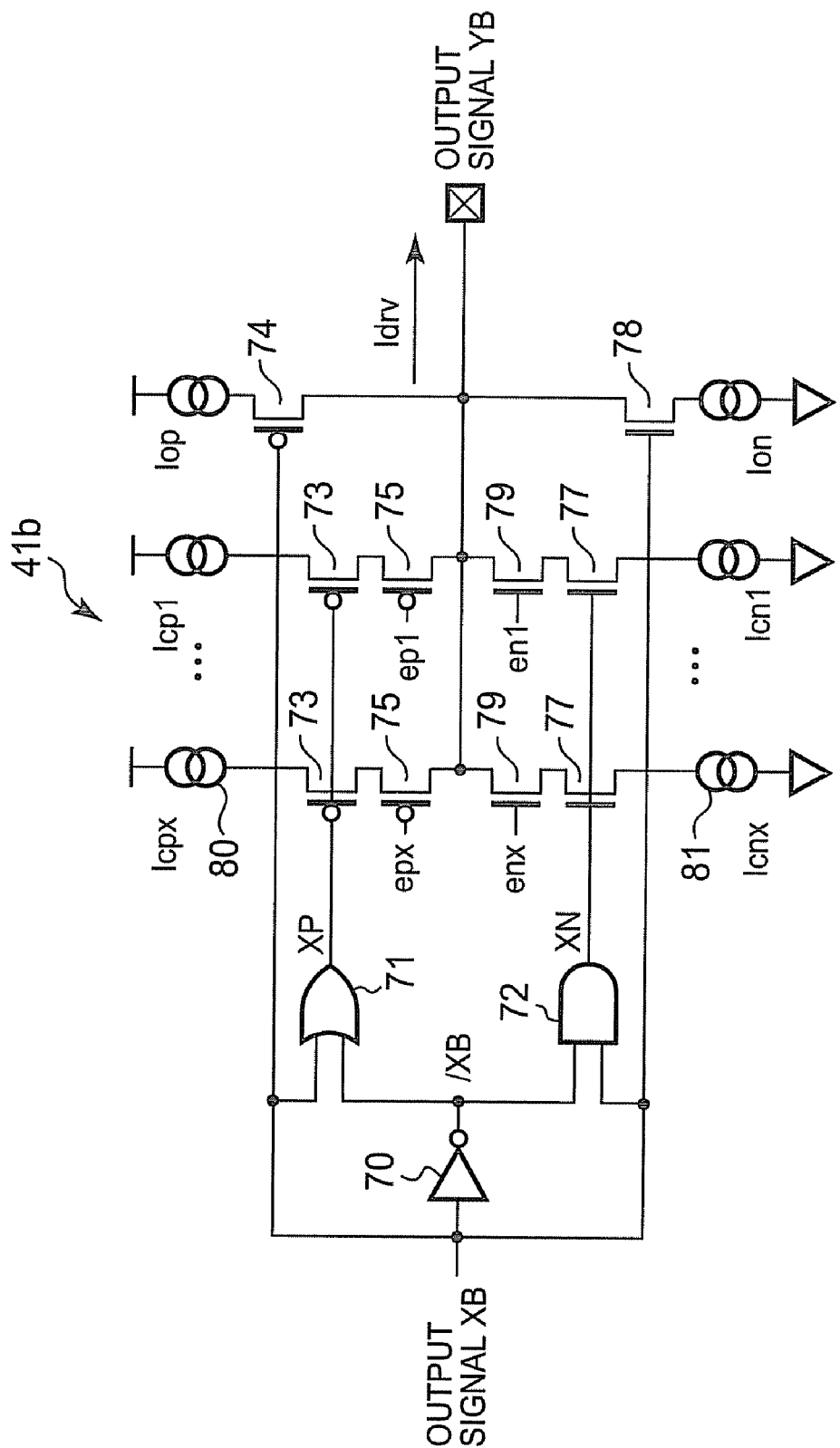
FIG. 7 is a block diagram showing an internal configuration of the driver.
Figure 8:
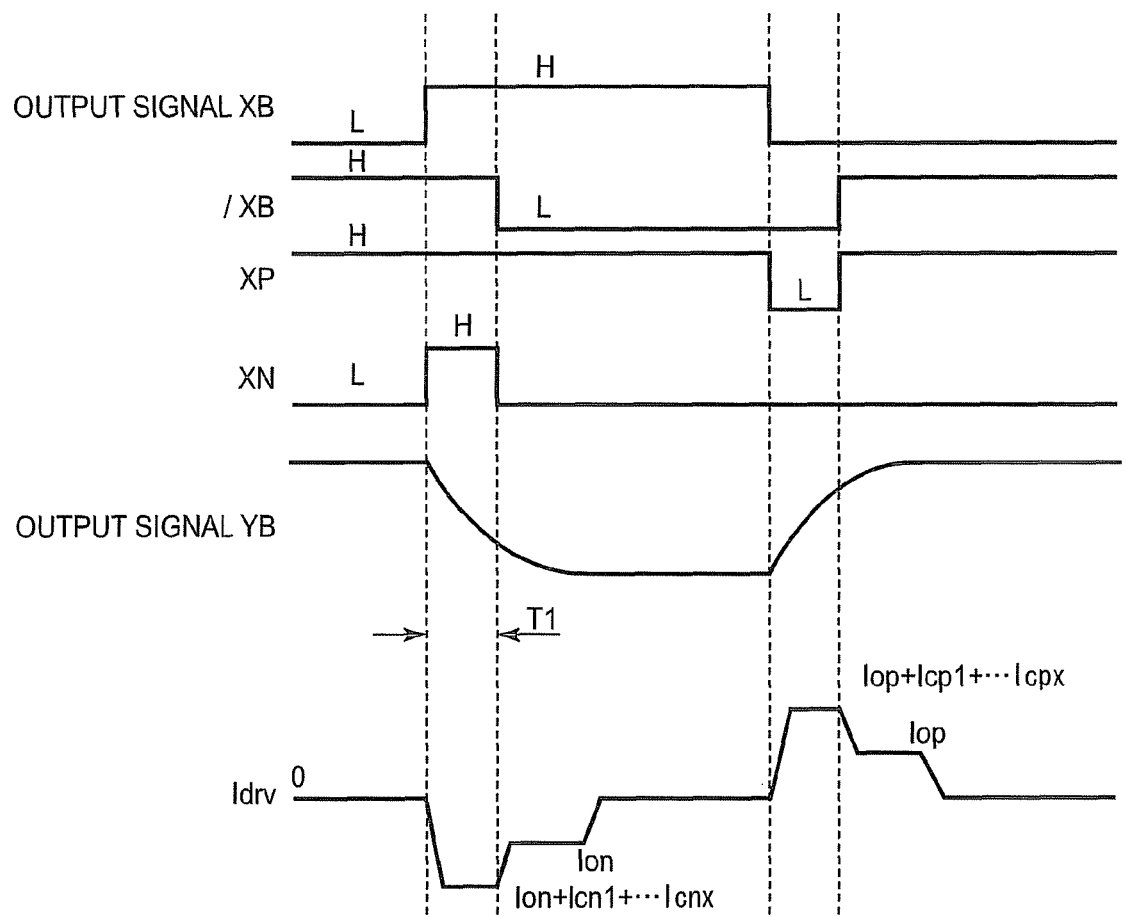
FIG. 8 is a view showing a timing chart of the driver of FIG. 7.

Subsequently, relationship between the adjustment quantity shown in FIG. 6 and the slew rate adjusted by the driver 41b of FIG. 4 will be explained with reference to FIGS. 7 and 8. FIG. 7 is a block diagram showing an internal configuration of a driver according to the first embodiment of the invention. FIG. 8 is a figure showing a timing chart of the driver of FIG. 7.

First, the table of FIG. 6 shows, as an example, the adjustment quantity output by the calculation circuit 51 and the slew rate corresponding to the value of the adjustment quantity. The adjustment quantity is represented by a value such as 1, 2 or 3. For example, when the adjustment quantity is "1", the slew rate is set to 25 psec. Likewise, the value of the adjustment quantity and the value of the slew rate correspond with each other such as follows. When the adjustment quantity=2, the slew rate is 50 psec. When the adjustment quantity=3, the slew rate is 75 psec.

The table of FIG. 6 shows current values Iop and Icp1-Icp3 of current flowing from a current source 80 to P-type transistors 73 to 75 in FIG. 7, and shows current values Ion and Icn1-Icn3 of current flowing from N-type transistors 77 to 79 to a current source 81 in FIG. 7.

For example, the values of the current flowing from the current source 80 to the P-type transistors 73 to 75 may be set as Icp1=2 mA, Icp2=4 mA, Icp3=8 mA, and Iop=10 mA. However, the values are not limited to the values. Likewise, for example, the values of the current flowing from the N-type transistors 77 to 79 to the current source 81 may be set as Icn1=2 mA, Icn2=4 mA, Icn3=8 mA, Ion=10 mA.

The table of FIG. 6 shows control signals ep1, ep2, ep3, en1, en2, and en3. The driver 41 generates control signal (for example, ep3=0, ep2=0, ep1=0) corresponding to the adjustment quantity (for example, the adjustment quantity 1). Each transistor is controlled by the control signal. The slew rate of the output signal (for example, YB) is set to a value corresponding to a current value, for example, Slew Rate=25 psec.

As described above, the driver 41b uses simplified values such as "1" or "8" as the adjustment quantity. Therefore, for example, the driver 41b can save the trouble of calculating mutual inductance every time the combination pattern of the output signals XA to XC changes.

The configuration and operation of the driver 41b will be specifically explained. The driver 41b of FIG. 7 mainly includes a NOT circuit 70, an OR circuit 71, an AND circuit 72, and P-type transistors 73, 74, 75, and N-type transistors 77, 78, 79.

The NOT circuit 70 reverses the output signal XB, and outputs a reverse signal /XB. The OR circuit 71 outputs a logical sum signal XP, i.e., a logical sum output of the output signal XB and signal /XB. The AND circuit 72 outputs a logical multiplication signal XN, i.e., a logical multiplication output of the output signal XB and the signal /XB. The P-type transistor 74 and the N-type transistor 78 control the current according to the output signal XB. The P-type transistors 73 control current according to the logical sum signal XP. The N-type transistors 77 control current according the logical multiplication signal XN. The P-type transistors 75 and the N-type transistors 79 operate according to the control signals epX and enX.

The NOT circuit 70 uses about 50% of rise/fall times of the output signal XB for adjustment. Alternatively, a combination of the NOT circuit 70 and a delay device may be used instead.

In FIG. 8, the signal XN maintains "H" state during a time (predetermined time) T1 from when the output signal XB input to the driver 41 changes from "L" to "H" to when the signal XN changes from "H" to "L". At this occasion the N-type transistors 77, 78 turn ON.

During the time T1, the signal calculation portion 42b calculates the adjustment quantity (1 to 8) based on the combination pattern of the output signals XA to XC, and outputs the adjustment quantity to the driver 41b. As shown in FIG. 6, the driver 41b generates a combination pattern of control signals en1, en2, and en3 based on the output signal XB and the adjustment quantity.

As a result, the current values Icn1, Lcn2, and Icn3 flow in the N-type transistor 79 according to the combination pattern of the control signals en1, en2, and en3. In other words, the driver 41 outputs the current value according to the adjustment quantity for a predetermined period of time. As described above, during the time T1, the value of drive current Idrv is a current value "Ion+Icn1+ . . . +IcnX".

A case where the time T1 passes will be hereinafter explained. When the signal /XB changes from "H" to "L" and accordingly the logical multiplication signal XN changes from "H" to "L", the N-type transistor 77 turns off. On the other hand, since the output signal X is in "H" state, the N-type transistor 78 is ON state.

As a result, a current value Ion, for example, 10 mA, as shown in FIG. 6 flows in the N-type transistor 78. In this way, the value of the drive current Idrv becomes the current value Ion after the time T1 passes.

The above-described time T1 represents an adjustment time for the slew rate. The driver 41b outputs the drive current Idrv during the time T1. The terminal end of the driver 41b is connected to a receiving circuit (not shown) and a transmission path (not shown) by PCB (Printed Circuit Board), and therefore, the driver 41b outputs an output signal YB according to the value of the drive current Idrv due to the parasitic capacitance and the terminating resistance.

Figure 3B:
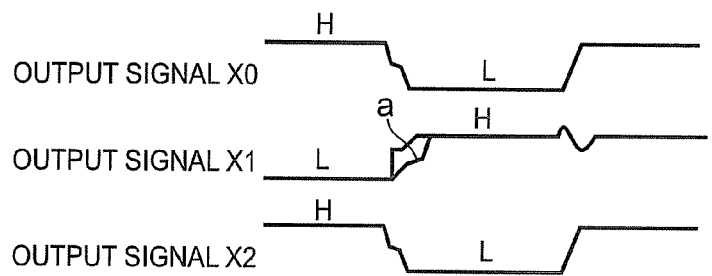

Accordingly, for example, when the slew rate of the output signal XB is 50 psec, the waveform of the adjacent signal 1 or 2 may deform as shown in the output signal X1 of FIG. 3B. In such case, the driver 41b sets the slew rate of the output signal X to a value slower than 50 psec, for example, 150 psec, and therefore the current value in the time T1 is adjusted to 18 mA. As a result, the crosstalk with respect to the adjacent signal XA and XC is reduced.

Likewise, the output signal XB input to the driver 41b is assumed to change from "H" to "L". In this case, during the time T1, the logical sum signal XP is "L" state. Both of the P-type transistors 73 and 74 turn on. In addition, during the time T1, the signal calculation portion 42 calculates the adjustment quantity (1 to 8) based on the combination pattern of the output signals XA to XC, and outputs the adjustment quantity to the driver 41b. As shown in FIG. 6, the driver 41b generates a combination pattern of control signals ep1, ep2, and ep3 based on the output signal XB and the adjustment quantity. As a result, current values Icp1, Icp2, and Icp3 flow in the P-type transistor 75 according to the combination pattern of the control signals ep1, ep2, and ep3.

As described above, during the time T1, the value of drive current Idrv is current values Iop+Icp1+IcpX. Subsequently, a case where the time T1 passes will be hereinafter explained. When the reverse signal /XB changes from "L" to "H" and accordingly the logical multiplication signal XP changes from "L" to "H", the P-type transistor 73 turns off.

On the other hand, since the output signal XB is in "L" state, the P-type transistor 75 is ON state. As a result, a current value Top (for example, 10 mA) as shown in FIG. 6 flows in the P-type transistor 74. In this way, the value of the drive current Idrv becomes the current value Top after the time T1 passes.

As described above, the signal drive circuit according to the embodiment calculates the adjustment quantity for reducing the slew rate of one signal based on a combination pattern of a adjustment coefficient of a crosstalk, which is previously obtained using a package model, the one specific signal transmitted to one specific signal wire and two adjacent signals. Further, the signal drive circuit adjusts slew rate of the one specific signal based on the adjustment quantity.

Therefore, the signal drive circuit according to the embodiment can reduce the crosstalk on an adjacent signal without repeating designing process of a package or sandwiching a ground between bonding wires. As a result, it takes less time to design the package, and it is not necessary to increase the number of ground wires. Accordingly, the number of usable signals does not decrease, and further, the cost of the package does not increase.

In the signal drive circuit according to the embodiment, the adjustment coefficients 31a to 31c are stored in the LSI internal memory 30. Therefore, the adjustment coefficients 31a to 31c can be set to the signal calculation portion 42 without using any external memory.

Figure 9:
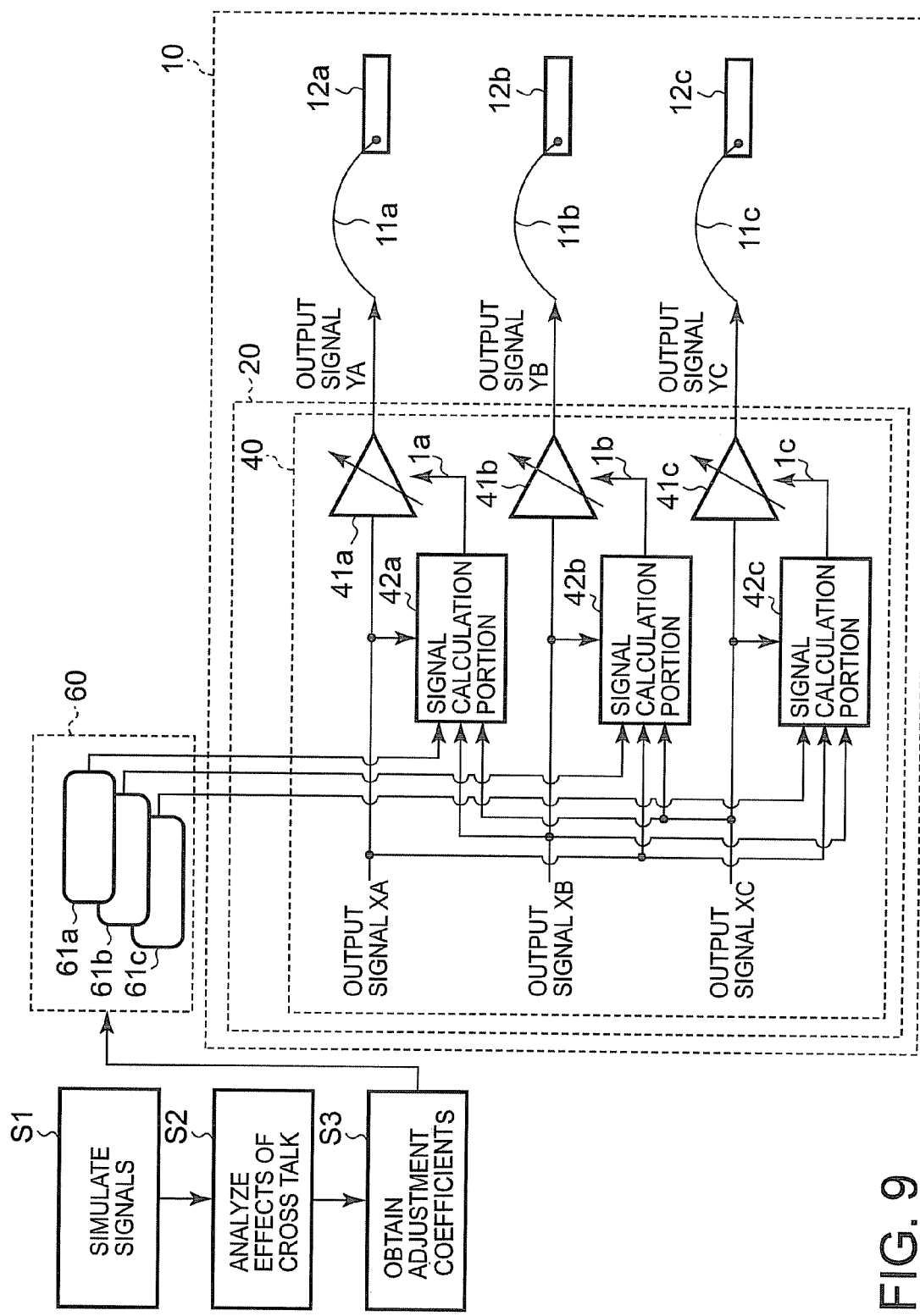
FIG. 9 is a block diagram showing a configuration of a semiconductor integrated circuit according to a second embodiment of the invention.

FIG. 9 is a block diagram showing a configuration of a semiconductor integrated circuit according to a second embodiment of the invention.

In the second embodiment, adjustment coefficients 61a to 61c stored in an LSI external memory 60 are used to generate adjustment quantities. In this way, since the adjustment coefficients 61a to 61c are stored in the LSI external memory 60, the adjustment coefficient 61a to 61c may be copied from the LSI external memory 60 to the LSI internal memory 30 after the LSI 10 is installed. Then, the adjustment quantities can be generated.

As described above, the signal drive circuit according to the embodiment includes the signal calculation portions 42a to 42c that outputs the adjustment quantities using the adjustment coefficients 61a to 61c stored in the LSI external memory 60. The drivers 41a to 41c control current amount based on the adjustment quantities. With the signal drive circuit according to the embodiment, as well as the signal drive circuit according to the first embodiment, it takes less time to design the package, and the cost of the package does not increase.

Further, for example, when there arises a factor causing crosstalk which can not be found in the simulation after the LSI 10 is installed, the settings of the adjustment coefficients 61a to 61c can be changed. Therefore, the degree of accuracy in correcting crosstalk can be further improved compared with the signal drive circuit according to the first embodiment.

Further the LSI 10 can be made smaller, and the flexibility in designing the LSI 10 can be improved.

When, for example, the bonding wires 11a and 11c as shown in FIGS. 1 to 9 exert the effect of crosstalk on the bonding wire 11b, the drivers 41a and 41c may adjust current values each having a different value. Even in such case, the signal drive circuit according to the first and the second embodiments can achieve similar effects as the above-described effects.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor integrated circuit for transmitting output signals based on a specific signal and two adjacent signals to a specific signal wire and two adjacent signal wires respectively, comprising:
    an adjustment quantity calculation portion to calculate an adjustment quantity representing a degree of decrease of a slew rate of the specific signal, based on an adjustment coefficient for reducing an occurrence amount of crosstalk arising between the specific signal wire and the two adjacent signal wires and the specific signal and the two adjacent signals; and
    a driver to adjust the slew rate of the specific signal based on the adjustment quantity and to transmit one of the output signals corresponding to the specific signal, wherein the driver outputs a current value corresponding to the adjustment quantity for a predetermined period of time and includes:
    a NOT circuit to output an reverse signal of the specific signal,
    an OR circuit to output a logical sum signal of the specific signal and the reverse signal,
    an AND circuit to output a logical multiplication signal of the specific signal and the reverse signal;
    a one conductive-type first transistor and an opposite conductive-type first transistor to control the current according to the specific signal;
    a one conductive-type second transistor to control the current according to the logical sum signal,
    an opposite conductive-type second transistor to control the current according to the logical multiplication signal; and
    a one conductive-type third transistor and an opposite conductive-type third transistor to operate according to a control signal and to connect with the one and the opposite conductive-type second transistors.

2. The circuit according to claim 1, wherein the driver outputs a current value corresponding to the adjustment quantity for a predetermined period of time.

3. The circuit according to claim 2, wherein the adjustment coefficient is stored in an external memory arranged outside the circuit.

4. The circuit according to claim 2, wherein the adjustment coefficient is stored in an internal memory arranged inside the circuit.

5. A semiconductor integrated circuit for transmitting output signals based on a specific signal and two adjacent signals to a specific signal wire and two adjacent signal wires respectively, comprising:
- an adjustment quantity calculation portion to calculate an adjustment quantity representing a degree of decrease of a slew rate of the specific signal, based on an adjustment coefficient for reducing an occurrence amount of crosstalk arising between the specific signal wire and the two adjacent signal wires and the specific signal and the two adjacent signals; and
- a driver to adjust the slew rate of the specific signal based on the adjustment quantity and to transmit one of the output signals corresponding to the specific signal, wherein the driver includes:
- a NOT circuit to output an reverse signal of the specific signal,
- an OR circuit to output a logical sum signal of the specific signal and the reverse signal,
- an AND circuit to output a logical multiplication signal of the specific signal and the reverse signal;
- a one conductive-type first transistor and an opposite conductive-type first transistor to control the current according to the specific signal;
- a one conductive-type second transistor to control the current according to the logical sum signal,
- an opposite conductive-type second transistor to control the current according to the logical multiplication signal; and
- a one conductive-type third transistor and an opposite conductive-type third transistor to operate according to a control signal and to connect with the one and the opposite conductive-type second transistors.

* * * * *